United States Patent
Matsui et al.

(10) Patent No.: US 6,598,185 B1
(45) Date of Patent: Jul. 22, 2003

(54) PATTERN DATA INSPECTION METHOD AND STORAGE MEDIUM

(75) Inventors: Showgo Matsui, Kawasaki (JP);
Katsuji Tabara, Kawasaki (JP);
Kazuhiko Takahashi, Kawasaki (JP);
Kunihiko Shiozawa, Kawasaki (JP);
Yoshiharu Ootani, Kawasaki (JP);
Syuzi Katase, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/514,151

(22) Filed: Feb. 28, 2000

(30) Foreign Application Priority Data

Mar. 17, 1999 (JP) ............................................. 11-072664

(51) Int. Cl.$^7$ ............................. H02H 3/05; G06K 9/00; G06F 17/50
(52) U.S. Cl. ............................. 714/48; 382/141; 716/19
(58) Field of Search .......................... 714/48; 382/141, 382/144, 145; 716/19, 20, 21; 700/105, 108, 109, 110, 119, 120, 121; 430/4, 5, 378, 34, 35

(56) References Cited

U.S. PATENT DOCUMENTS

| | | | | |
|---|---|---|---|---|
| 4,774,461 A | * | 9/1988 | Matsui et al. | 348/126 |
| 4,809,341 A | * | 2/1989 | Matsui et al. | 382/144 |
| 5,830,606 A | * | 11/1998 | Okamoto | 430/5 |
| 5,850,467 A | * | 12/1998 | Matsui et al. | 382/145 |
| 6,285,783 B1 | * | 9/2001 | Isomura et al. | 382/147 |
| 6,360,134 B1 | * | 3/2002 | Van Den Broeke | 700/121 |
| 6,400,838 B2 | * | 6/2002 | Watanabe | 382/144 |

FOREIGN PATENT DOCUMENTS

JP    3-208358    9/1991

* cited by examiner

Primary Examiner—Robert Beausoliel
Assistant Examiner—Emerson Puente
(74) Attorney, Agent, or Firm—Staas & Halsey LLP (57) ABSTRACT

A pattern data inspection method includes the steps of (a) carrying out a logical/sizing process with respect to original pattern data, (b) carrying out a reverse-logical/reverse-sizing process with respect to pattern data subjected to the logical/sizing process, and (c) carrying out a logical process with respect to the original pattern data and pattern data subjected to the reverse-logical/reverse-sizing process, and inspecting the pattern data subjected to the logical/sizing process.

8 Claims, 9 Drawing Sheets

PATTERN DATA INSPECTION METHOD AND STORAGE MEDIUM

BACKGROUND OF THE INVENTION

1. Field of the Invention

The present invention generally relates to pattern data inspection methods and storage mediums, and more particularly to a pattern data inspection method which guarantees data when processing pattern data such as design data, exposure data and inspection data which are used for producing a semiconductor device or the like, and to a computer-readable storage medium which stores a program for causing a computer to carrying out a process based on such a pattern data inspection method.

Recently, when producing a semiconductor device such as a large scale integrated (LSI) circuit device, a memory device, a magnetic device, a liquid crystal display (LCD) device and plasma display panel (PDP), there are demands to minimize the time it takes from the time when the semiconductor device is developed to the time when the semiconductor device is actually produced and forwarded. In order to satisfy such demands, it is necessary to guarantee data when processing pattern data such as design data, exposure data and inspection data which are used for producing the semiconductor device. By guaranteeing the data when processing the pattern data, it is possible to judge whether or not the data processing such as a conversion process is correctly performed, thereby making it possible to quickly find software bugs and hardware bugs at an early stage.

2. Description of the Related Art

In this specification, the "design data" refers to the pattern data including layout data related to a layout of the semiconductor device which is to be produced. In addition, the "exposure data" refers to the pattern data including data which are obtained by subjecting the design data to a data processing such as a data conversion process and are necessary to expose a reticle or mask used to produce the semiconductor device. Further, the "inspection data" refers to the pattern data including data related to the designed reticle or mask for use in comparing the actually produced reticle or mask.

In addition, a "logical/sizing process" which will be described later refers to at least one of a logical process and a sizing process. Similarly, a "reverse-logical/reverse-sizing process" which will be described later refers to at least one of a reverse-logical process and a reverse-sizing process.

Figure 1:
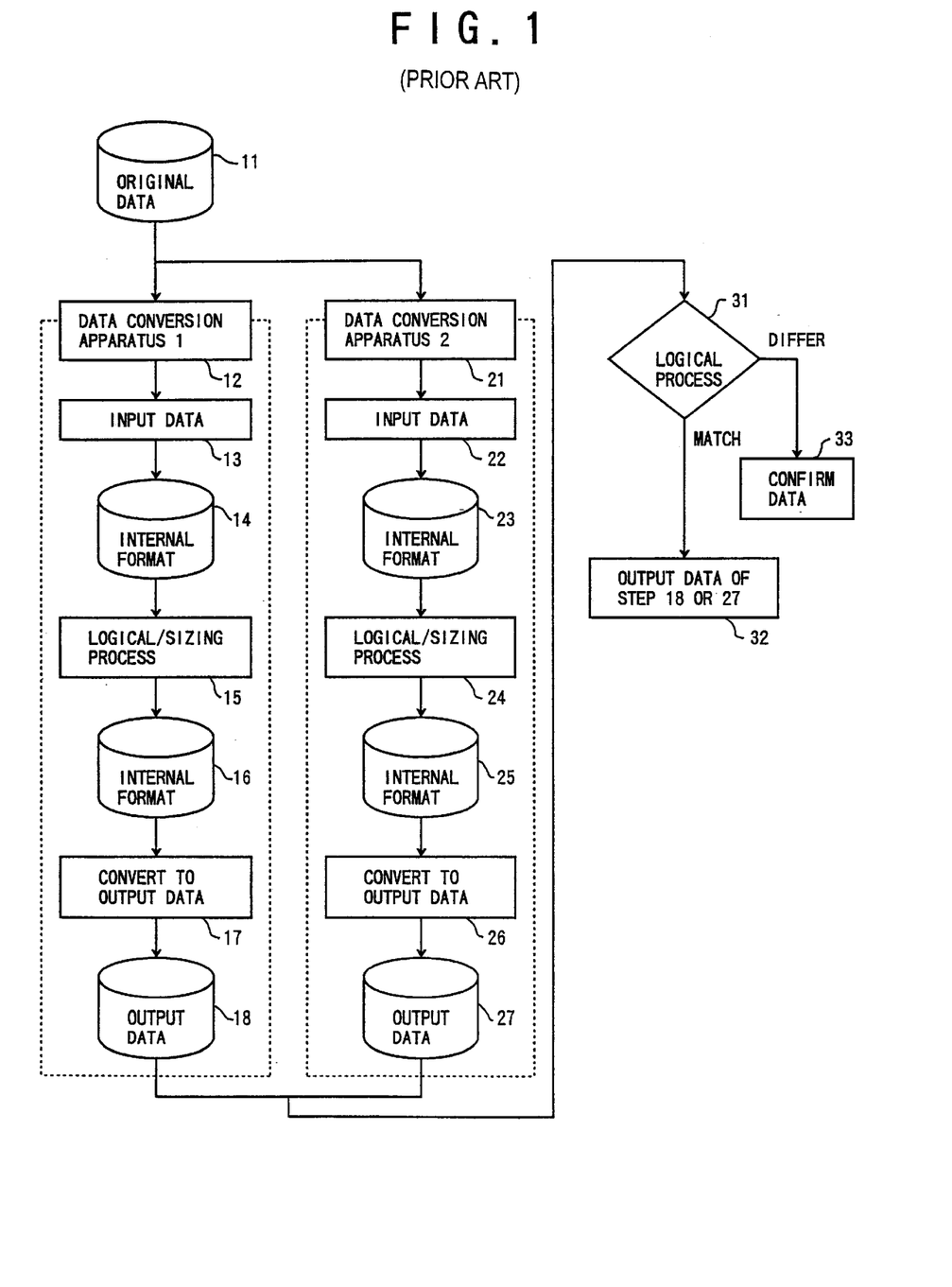
FIG. 1 is a flow chart for explaining an example of a conventional pattern data inspection method.

FIG. 1 is a flow chart for explaining an example of a conventional pattern data inspection method. In FIG. 1, original data 11 are made up of design data which are used to produce a semiconductor device. Apparatuses 12 and 21 respectively subject the design data to a data conversion process.

A step 13 inputs the original data 11, and a step 14 stores the original data 11 in the form of data having an internal format suited for a subsequent process which will be described later, in a storage unit. Similarly, a step 22 inputs the original data 11, and a step 23 stores the original data 11 in the form of data having the internal format suited for a subsequent process which will be described later, in a storage unit.

A step 15 carries out a logical/sizing process with respect to the data having the internal format and stored in the step 14, and obtains exposure data and/or inspection data of a reticle or mask which is used to produce the semiconductor device. A step 16 stores the exposure data and/or the inspection data in the storage unit in the form of data having an internal format suited for preventing multiple exposures. The logical/sizing process includes a known logical process such as an AND process and an OR process, and a known sizing process which carries out a pattern fattening or thinning process.

On the other hand, a step 24 carries out a logical/sizing process with respect to the data having the internal format and stored in the step 23, and obtains exposure data and/or inspection data of a reticle or mask which is used to produce the semiconductor device. A step 25 stores the exposure data and/or the inspection data in the storage unit in the form of data having an internal format suited for preventing multiple exposures.

A step 17 converts the data having the internal format and stored in the step 16 into output data suited for the actual exposure and/or inspection, and a step 18 stores the output data in the storage unit. On the other hand, a step 26 converts the data having the internal format and stored in the step 25 into output data suited for the actual exposure and/or inspection, and a step 27 stores the output data in the storage unit.

A step 31 carries out a logical process which compares the output data obtained from a first processing system which is made up of the steps 12 through 18, and the output data obtained from a second processing system which is made up of the steps 21 through 27. The first processing system and the second processing system use programs of mutually different internal formats and logical/sizing processes. For this reason, when the output data compared in the step 31 match, a step 32 guarantees the original data 11, and the production and forwarding of the semiconductor device are made using the output data obtained from the first or second processing system. On the other hand, when the output data compared in the step 31 do not match, a step 33 confirms the data to find software bugs and/or hardware bugs, and carries out the necessary modifications.

However, according to the conventional pattern data inspection method, the same original data are processed by two independent processing systems, namely, the first processing system and the second processing system. For this reason, it is necessary to provide two data processing apparatuses, and there is a problem in that the equipment cost becomes high.

In addition, if the same bug exists in the programs of the mutually different internal formats and logical/sizing processes used in the two processing systems, the output data from the two processing systems will include the same error. Consequently, such a bug cannot be found by comparing the output data from the two processing systems, and there is a problem in that the original data cannot be guaranteed accurately.

SUMMARY OF THE INVENTION

Accordingly, it is a general object of the present invention to provide a novel and useful pattern data inspection method and storage medium, in which the problems described above are eliminated.

Another and more specific object of the present invention is to provide a pattern data inspection method and computer-readable storage medium, which can positively and accurately guarantee the original pattern data, while maintaining the equipment cost low.

Still another object of the present invention is to provide a pattern data inspection method comprising the steps of (a)

carrying out a logical/sizing process with respect to original pattern data, (b) carrying out a reverse-logical/reverse-sizing process with respect to pattern data subjected to the logical/sizing process, and (c) carrying out a logical process with respect to the original pattern data and pattern data subjected to the reverse-logical/reverse-sizing process, and inspecting the pattern data subjected to the logical/sizing process. According to the pattern data inspection method of the present invention, it is possible to positively and accurately guarantee the original pattern data, while maintaining the equipment cost low.

A further object of the present invention is to provide a computer-readable storage medium which stores a program for causing a computer to inspect pattern data, comprising first means for causing the computer to carry out a logical/sizing process with respect to original pattern data, second means for causing the computer to carry out a reverse-logical/reverse-sizing process with respect to pattern data subjected to the logical/sizing process, and third means for causing the computer to carry out a logical process with respect to the original pattern data and pattern data subjected to the reverse-logical/reverse-sizing process, and inspect the pattern data subjected to the logical/sizing process. According to the computer-readable storage medium of the present invention, it is possible to positively and accurately guarantee the original pattern data, while maintaining the equipment cost low.

Other objects and further features of the present invention will be apparent from the following detailed description when read in conjunction with the accompanying drawings.

DESCRIPTION OF THE PREFERRED EMBODIMENTS

Figure 2:
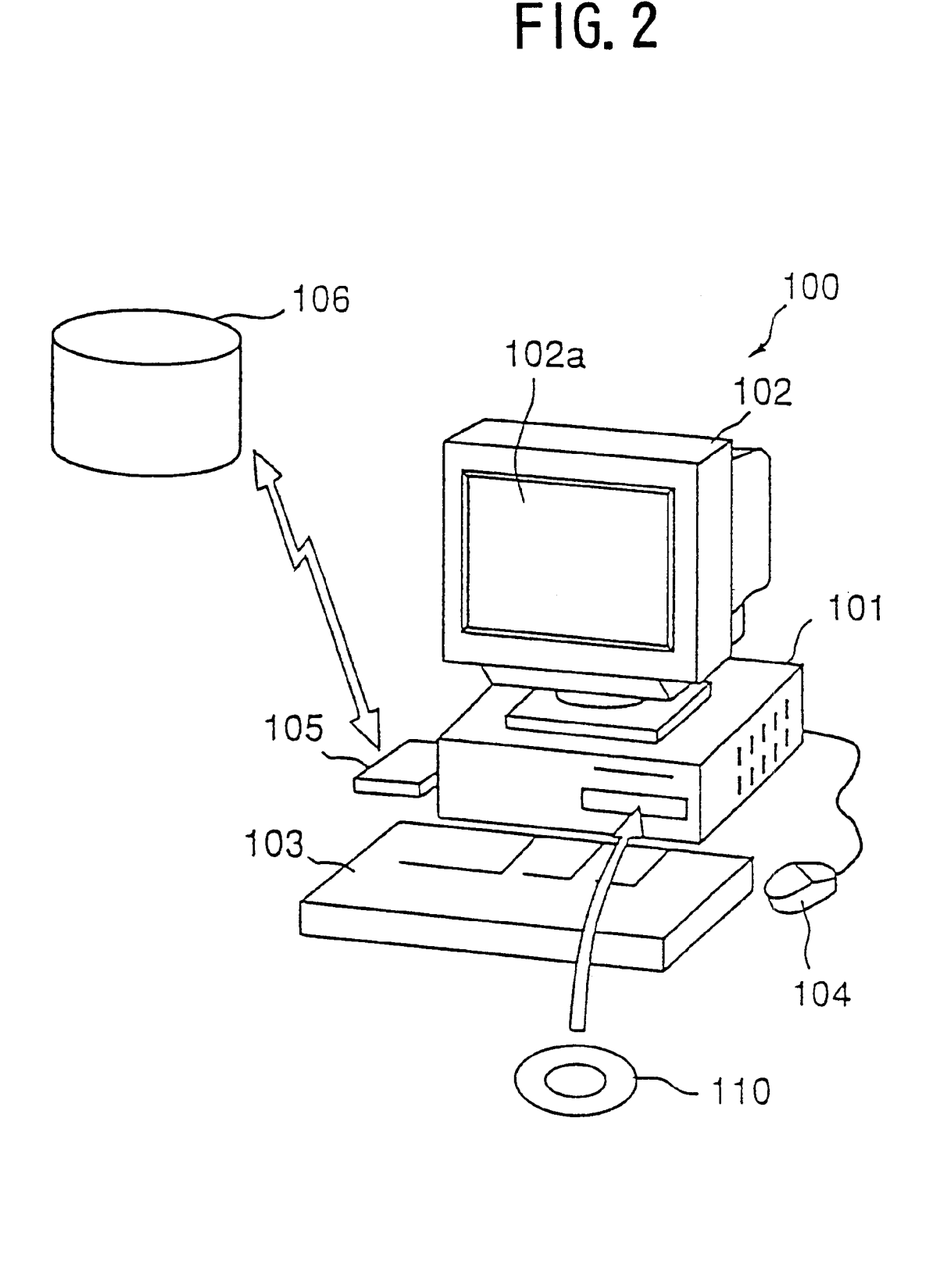
FIG. 2 is a perspective view showing a computer system which carries out an embodiment of a pattern data inspection method according to the present invention.

FIG. 2 is a perspective view showing a computer system which carries out an embodiment of a pattern data inspection method according to the present invention. This embodiment of the pattern data inspection method employs an embodiment of a computer-readable storage medium according to the present invention.

A computer system 100 shown in FIG. 2 is formed by a general purpose computer such as a personal computer. The computer system 100 includes a main body 101 which includes a CPU, a disk drive and the like, a display 102 for displaying an image on a display screen 102 in response to an instruction from the main body 101, a keyboard 103 for inputting various information to the computer system 100, a mouse 104 for specifying an arbitrary position on the display screen 102a of the display 102, and a modem 105 for accessing an external database or the like and downloading a program and the like stored in another computer system. Programs which are stored in a portable recording medium such as a disk 110 or, which are downloaded from a recording medium 106 of another computer system using a communication unit such as the modem 105, are input to the computer system 100 and compiled therein. The programs include a program which causes the CPU of the computer system 100 to carry out a process using this embodiment of the pattern data inspection method.

In this embodiment of the computer-readable storage medium, the storage medium is formed by a recording medium such as the disk 110 which stores the above described program. The recording medium is not limited to a portable recording medium such as IC card memories, floppy disks, magneto-optical disks, CD-ROMs and various kinds of semiconductor memory devices, and includes recording medium accessible by a computer system which is coupled via a communication unit or a communication means such as a modem and a LAN.

Figure 3:
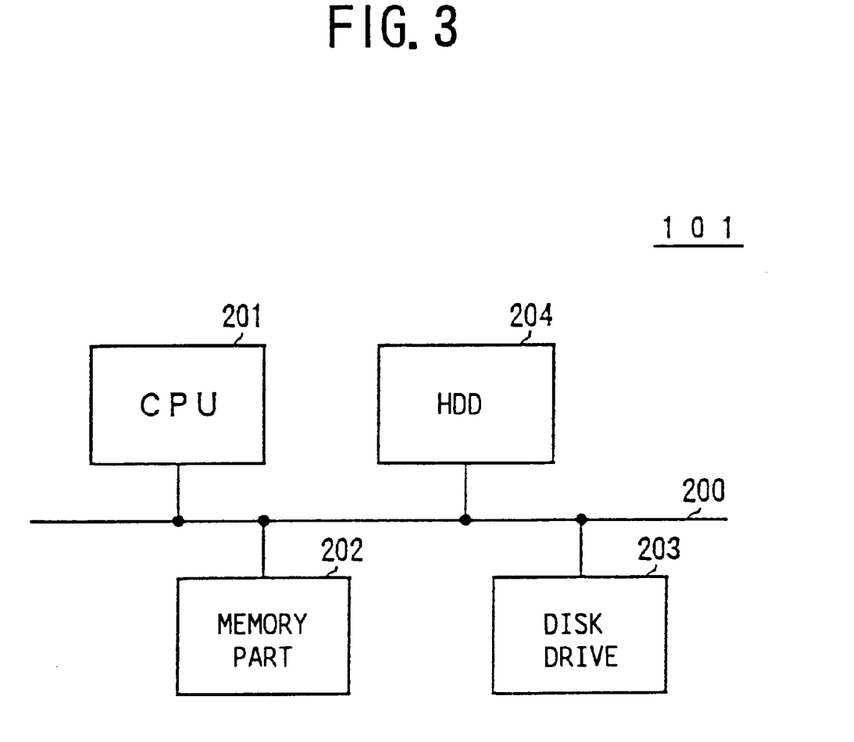
FIG. 3 is a system block diagram showing the construction of an important part of a main body of the computer system.

FIG. 3 is a system block diagram showing the construction of an important part within the main body 101 of the computer system 100. In FIG. 3, the main body 100 generally includes a CPU 201, a memory part 202 which includes a RAM, a ROM or the like, a disk drive 203 for driving the disk 110, and a hard disk drive (HDD) 204 which are coupled via a bus 200.

The construction of the computer system 100 is of course not limited to that shown in FIGS. 2 and 3, and various known constructions may be used instead.

Figure 4:
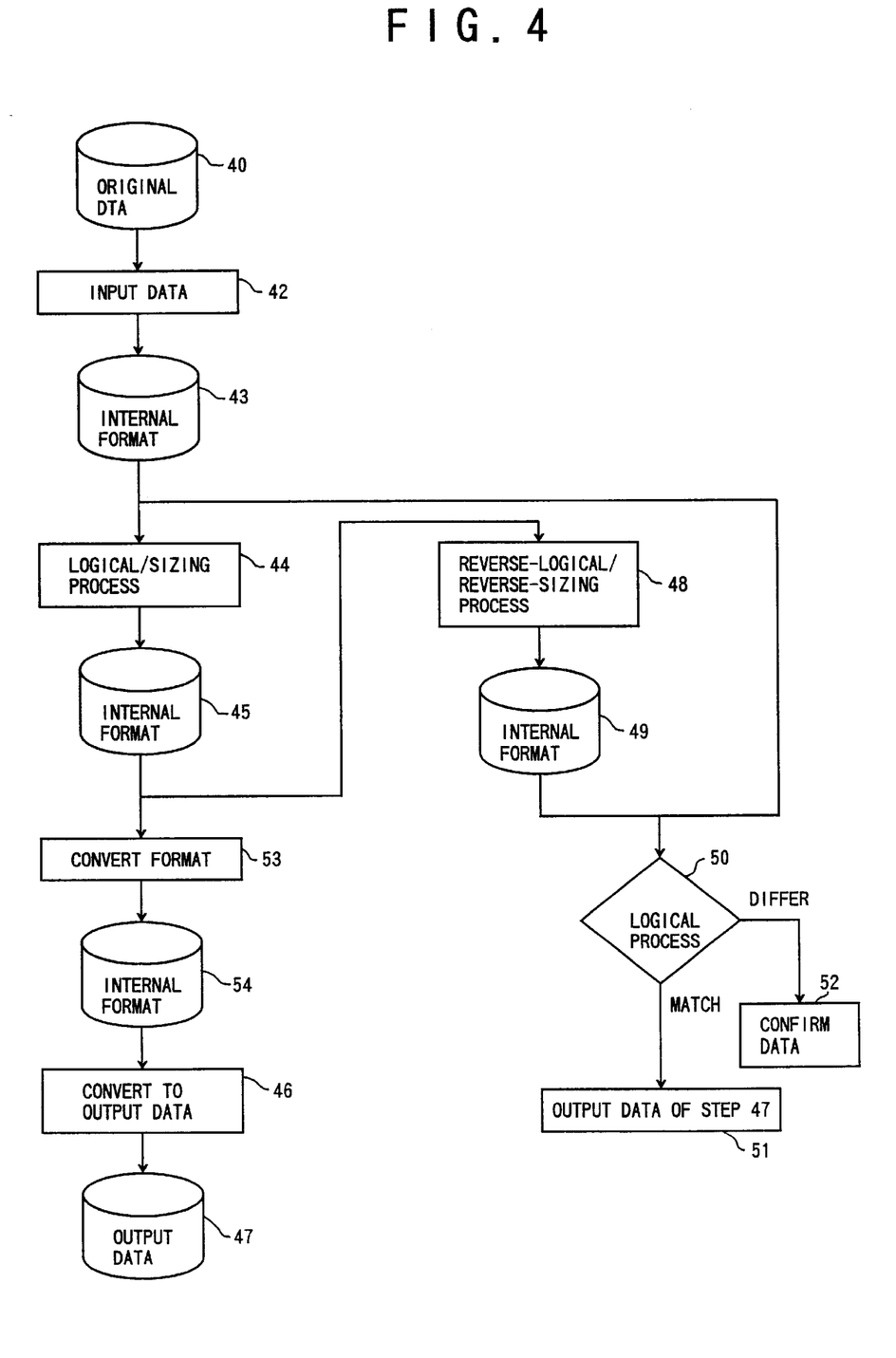
FIG. 4 is a flow chart for explaining the operation of a CPU of the embodiment.

FIG. 4 is a flow chart for explaining the operation of the CPU 201 in this embodiment. In FIG. 4, a step 40 reads original data from a storage unit such as the memory part 202 and the hard disk drive 204. The original data include design data which are used to produce a semiconductor device. In this embodiment, it is assumed for the sake of convenience that the original data are pattern data related to rectangular patterns 501 and 502 shown in FIG. 5. In this case, vertex coordinates of the rectangular pattern 501 are (C5, C3, I3, I5), and vertex coordinates of the rectangular pattern 502 are (J6, J4, P4, P6). The original data include data of these vertex coordinates.

In FIG. 5 and FIGS. 6 through 16 which will be described later, numerals shown along the vertical direction and alphabets shown along the horizontal direction respectively indicate coordinate values.

Figure 5:
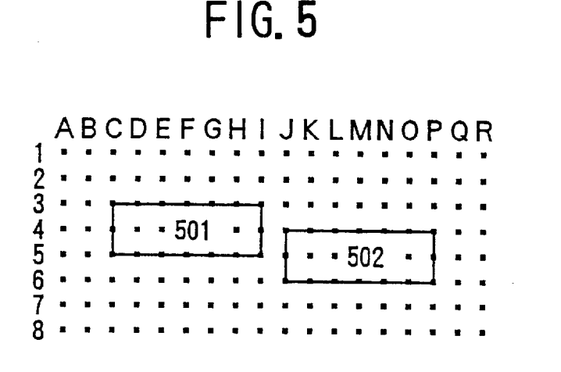
FIG. 5 is a diagram for explaining original data.

In FIG. 4, a step 42 inputs the original data read in the step 41, and a step 43 stores the original data in the storage unit such as the memory part 202 and the hard disk drive 204, in the form of data having an internal format suited for a subsequent process such as a logical/sizing process which will be described later. A step 44 carries out the logical/sizing process with respect to the data having the internal format and stored in the step 43, so as to obtain exposure data and/or inspection data of a reticle or mask which is used to produce the semiconductor device. A step 45 stores the exposure data and/or inspection data in the storage unit such as the memory part 202 and the hard disk drive 204, in the form of data having the internal format. The logical/sizing process includes a known logical process such as the AND process and the OR process, and a known sizing process such as a pattern fattening or thinning process. For example, if the logical/sizing process in the step 44 is a sizing process which instructs "a shift of plus two", the pattern data shown in FIG. 5 is converted into pattern data related to rectangular patterns 503 and 504 shown in FIG. 6. In this case, the rectangular pattern 503 has vertex coordinates (A7, A1, K1, K7), and the rectangular pattern 504 has vertex coordinates (H8, H2, R2, R8). The exposure data and/or inspection data include all of these vertex coordinates.

Figure 7:
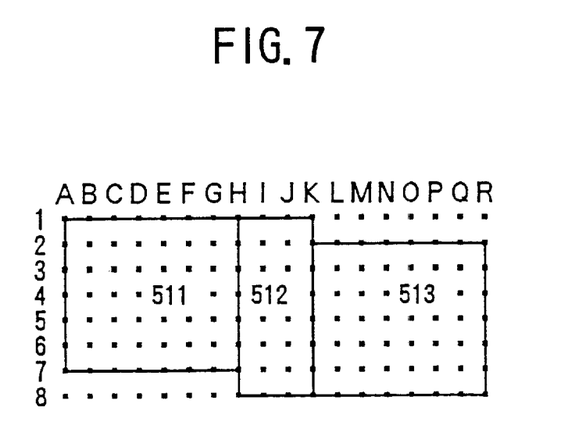
FIG. 7 is a diagram for explaining output data.

A step 53 carries out a format conversion process with respect to the data having the internal format and stored in the step 45, and a step 54 stores the data having the converted format into the storage unit such as the memory part 202 and the hard disk drive 204, as data having an internal format suited for preventing multiple exposures. For example, the data stored in the step 54 are pattern data related to rectangular patterns 511, 512 and 513 shown in FIG. 7 or, pattern data related to rectangular patterns 517, 518 and 519 shown in FIG. 8. In FIG. 7, the rectangular pattern 511 has vertex coordinates (A7, A1, H1, H7), the rectangular pattern 512 has vertex coordinates (H8, H1, K1, K8), and the rectangular pattern 513 has vertex coordinates (A2, K2, R2, R8). In addition, in FIG. 8, the rectangular pattern 517 has vertex coordinates (A2, K2, K1, A1), the rectangular pattern 518 has vertex coordinates (A7, R7, R2, A2), and the rectangular pattern 519 has vertex coordinates (H8, R8, R7, H7). In this case, the data stored in the storage unit in the step 54 include the vertex coordinates of the rectangular patterns 511 through 513 shown in FIG. 7 or, the vertex coordinates of the rectangular patterns 517 through 519 shown in FIG. 8. A step 46 converts the data having the converted format into output data suited for the actual exposure and/or inspection, and a step 47 stores the output data in the storage unit such as the memory part 202 and the hard disk drive 204.

On the other hand, a step 48 is carried out in parallel with the step 53 described above.

The step 48 carries out a reverse-logical/reverse-sizing process with respect to the data having the internal format and stored in the step 45, so as to obtain the exposure data and/or inspection data which are returned to the original state (hereinafter simply referred to as the original exposure data and/or inspection data). A step 49 stores the original exposure data and/or inspection data in the storage unit such as the memory part 202 and the hard disk drive 204 in the form of data having the same internal format as that used in the step 43.

Figure 6:
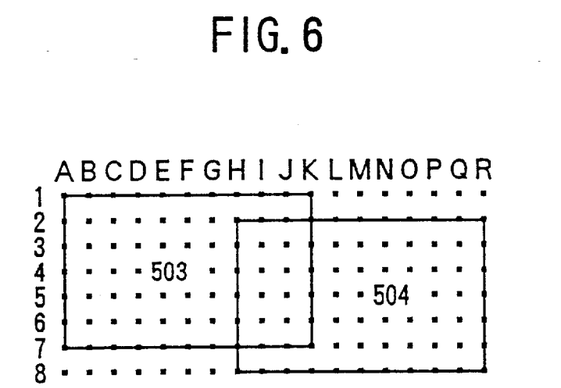
FIG. 6 is a diagram for explaining a logical/sizing process.
Figure 9:
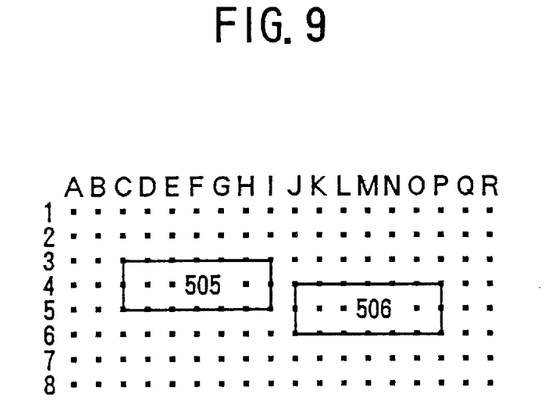
FIG. 9 is a diagram for explaining a reverse-logical/reverse-sizing process.

The reverse-logical/reverse-sizing process carried out in the step 48 is a reverse process of the logical/sizing process carried out in the step 44, and thus, the data obtained by the reverse-logical/reverse-sizing process become the same as the data prior to carrying out the logical/sizing process if the process is carried out correctly. In this embodiment, the pattern data related to the rectangular patterns 503 and 504 shown in FIG. 6 are converted into the pattern data related to rectangular patterns 505 and 506 shown in FIG. 9 by this reverse-logical/reverse-sizing process. In FIG. 9, the rectangular pattern 505 has vertex coordinates (C5, C3, I3, I5), and the rectangular pattern 506 has vertex coordinates (J6, J4, P4, P6). The data stored into the storage unit in the step 49 include all of these vertex coordinates.

A step 50 carries out a logical process with respect to the data having the internal format and stored in the step 43, and the data having the internal format and stored in the step 49. More particularly, this embodiment carries out the logical process to compare the data stored in the steps 43 and 49. Hence, when the data compared in the step 50 match, a step 51 guarantees the original data, and produces and forwards the semiconductor device using the output data stored in the step 47. On the other hand, when the data compared in the step 50 do not match, a step 52 confirms the data so as to find software bugs and/or hardware bugs, and carries out the necessary modifications depending on the bugs found.

In this particular case, the pattern data related to the rectangular patterns 501 and 502 shown in FIG. 5 stored in the step 43 and the pattern data related to the rectangular patterns 505 and 506 shown in FIG. 9 stored in the step 49 match, and thus, the step 51 guarantees the original data.

Figure 10:
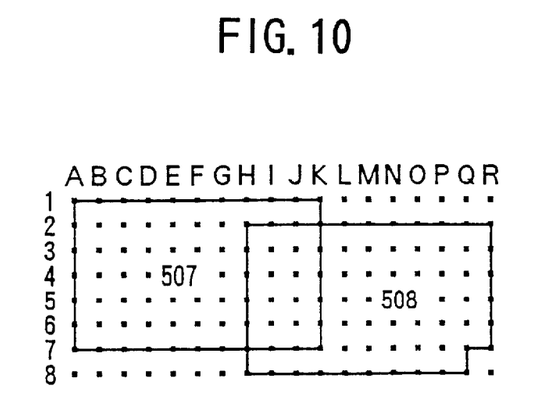
FIG. 10 is a diagram for explaining a case where dropout of data occurs by the logical/sizing process.
Figure 11:
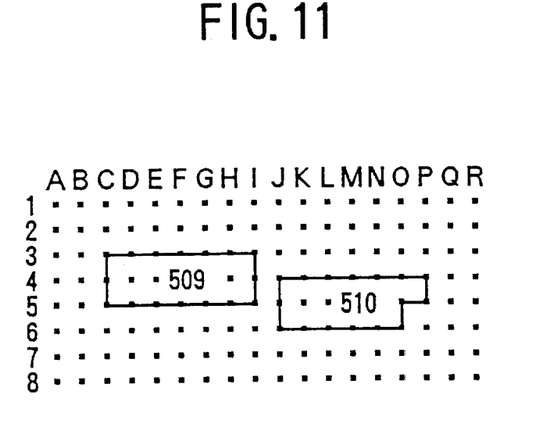
FIG. 11 is a diagram for explaining a case where the reverse-logical/reverse-sizing process is carried out with respect to the data shown in FIG. 10.

Accordingly, if pattern data related to rectangular patterns 507 and 508 shown in FIG. 10, for example, are stored in the step 45 due to the software bugs and/or hardware bugs, the step 49 stores pattern data related to rectangular patterns 509 and 510 shown in FIG. 11. In this case, the pattern data related to the rectangular patterns 501 and 502 shown in FIG. 5 and stored in the step 43, and the pattern data related to the rectangular patterns 509 and 510 shown in FIG. 11 and stored in the step 49, become different. Hence, the step 52 confirms the data in this case to find the software bugs and/or hardware bugs, and carries out the necessary modifications.

In FIG. 10, the rectangular pattern 507 has vertex coordinates (A7, A1, K1, K7), and the rectangular pattern has vertex coordinates (H8, Q8, Q7, R7, R2, H2). The data stored into the storage unit in the step 45 include all of these vertex coordinates.

On the other hand, in FIG. 11, the rectangular pattern 509 has vertex coordinates (C5, C3, I3, I5), and the rectangular pattern 510 has vertex coordinates (J6, O6, O5, P5, P4, J4). Hence, the data stored into the storage unit in the step 49 include all of these vertex coordinates.

In this embodiment, the pattern data related to the rectangular patterns shown in FIG. 6 or 10 include all of the vertex coordinates of the rectangular patterns corresponding to all vertex information of the patterns within the original data. In other words, in the case shown in FIG. 6, the rectangular patterns 503 and 504 partially overlap, but all of the original vertex coordinates of the rectangular patterns 503 and 504 before these rectangular patterns 503 and 504 are overlapped are included in the pattern data. For this reason, even when the reverse-logical/reverse-sizing process is carried out in the step 48, it is possible to obtain accurate pattern data, without losing information of the vertex coordinates corresponding to the original data. As a result, it is possible to positively find the software bugs and/or hardware bugs by the logical process carried out in the step 50.

That is, when the bug is generated in at least one of the logical/sizing process carried out in the step 44 and the reverse-logical/reverse-sizing process carried out in the step 48, it is possible to positively find the bug by the logical process carried out in the step 50.

Next, a description will be given of the problems introduced in a case where the step 48 carries out the reverse-logical/reverse-sizing process with respect to the pattern data stored in the step 54, and not with respect to the pattern data stored in the step 45.

Figure 12:
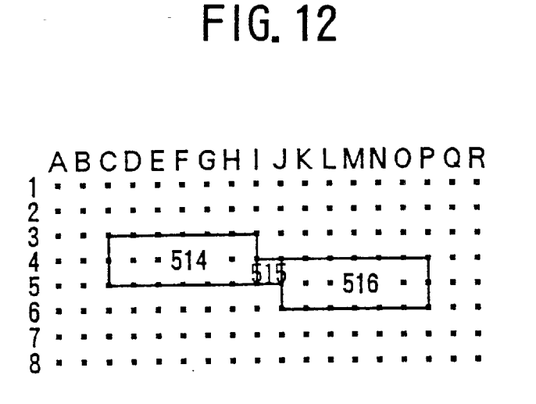
FIG. 12 is a diagram for explaining a case where the reverse-logical/reverse-sizing process is carried out with respect to the output data shown in FIG. 7.

FIG. 12 shows the pattern data related to rectangular patterns 514, 515 and 516 which are obtained when the step 48 carries out the reverse-logical/reverse-sizing process with respect to the pattern data which are shown in FIG. 7 and stored in the step 54. In FIG. 12, the rectangular pattern 514 has vertex coordinates (C5, C3, I3, I5), the rectangular pattern 515 has vertex coordinates (I5, I4, J4, J5), and the rectangular pattern 516 has vertex coordinates (J6, J4, P4, P6). Hence, when the reverse-logical/reverse-sizing process is carried out with respect to the pattern data which have been converted into the internal format suited for preventing the multiple exposures, a part of the vertex information corresponding to the original data is lost, thereby making it impossible to accurately restore or reproduce the original data even when the reverse-logical/reverse-sizing process is carried out.

Figure 8:
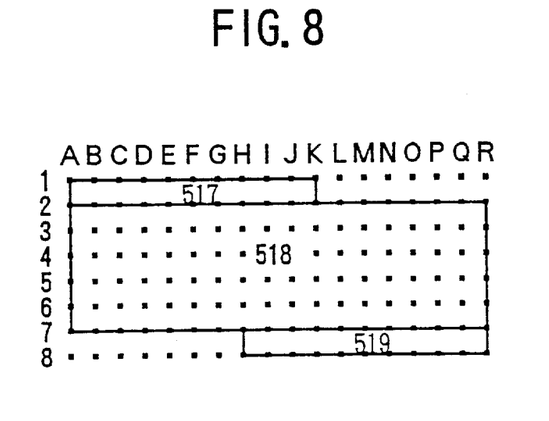
FIG. 8 is a diagram for explaining the output data.
Figure 13:
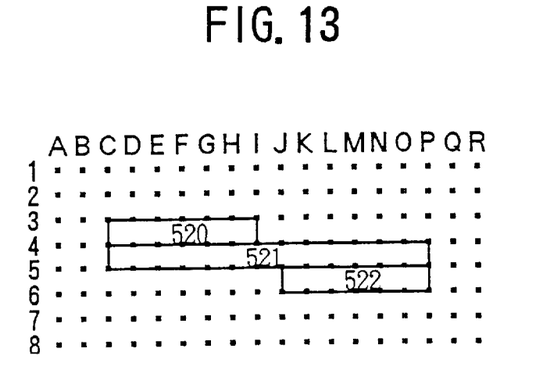
FIG. 13 is a diagram for explaining a case where the reverse-logical/reverse-sizing process is carried out with respect to the output data shown in FIG. 8.

FIG. 13 shows pattern data related to rectangular patterns 520 through 522 which are obtained when the step 48 carries out the reverse-logical/reverse-sizing process with respect to the pattern data which are shown in FIG. 8 and stored in the step 54. In FIG. 13, the rectangular pattern 520 has vertex coordinates (C4, I4, I3, C3), the rectangular pattern 521 has vertex coordinates (C5, P5, P4, C4), and the rectangular pattern 522 has vertex coordinates (J6, P6, P5, J5). Hence, when the reverse-logical/reverse-sizing process is carried out with respect to the pattern data which have been converted into the internal format suited for preventing the multiple exposures, a part of the vertex information corresponding to the original data is lost, thereby making it impossible to accurately restore or reproduce the original data even when the reverse-logical/reverse-sizing process is carried out.

In this embodiment, it is assumed for the sake of convenience that the logical/sizing process carried out in the step 44 shown in FIG. 4 consists solely of the sizing process, and thus, the reverse-logical/reverse-sizing process carried out in the step 48 consists solely of the reverse-sizing process. However, when the logical/sizing process carried out in the step 44 shown in FIG. 4 consists solely of the logical process or consists of both the logical process and the sizing process, the reverse-logical/reverse-sizing process carried out in the step 48 of course consists solely of the reverse-logical process or consists of both the reverse-logical process and the reverse-sizing process.

Next, a description will be given of the logical process, by referring to FIGS. 14 through 16. The logical process is used to process patterns of different layers forming the semiconductor device, for example. For the sake of convenience, it is assumed in the following description that the logical process is an AND process.

Figure 14:
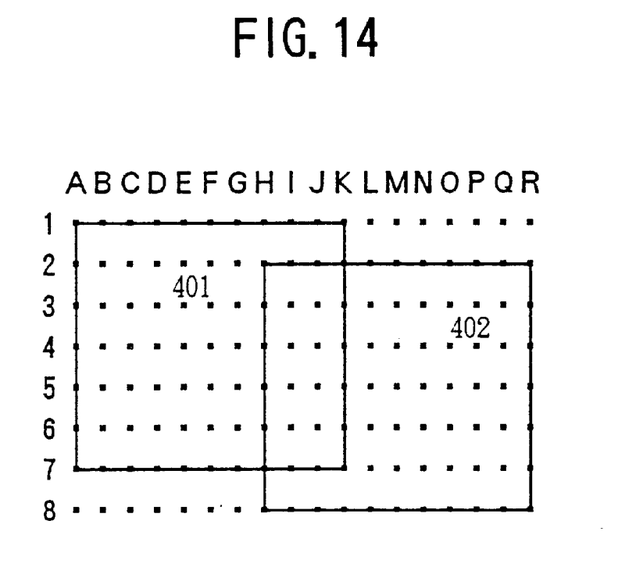
FIG. 14 is a diagram for explaining a logical process of the logical/sizing process.

FIG. 14 is a diagram showing patterns forming the original data which are stored in the step 40 shown in FIG. 4. In this case, the original data includes pattern data related to a graphic pattern 401, and pattern data related to a graphic pattern 402. The original data stored in the step 40 include vertex coordinates of each of the graphic patterns 401 and 402 as graphic information. The graphic information (vertex coordinates) of the graphic pattern 401 is (A1, A7, K7, K1), and the graphic information (vertex coordinates) of the graphic pattern 402 is (H2, H8, R8, R2).

Figure 15:
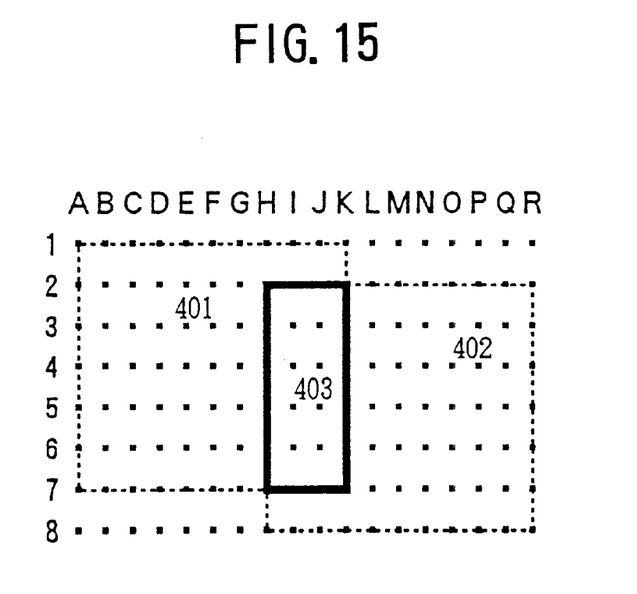
FIG. 15 is a diagram for explaining the logical process of the logical/sizing process.

FIG. 15 is a diagram showing a graphic pattern 403 which is obtained by carrying out the AND process with respect to the graphic patterns 401 and 402 shown in FIG. 14. In this case, the graphic information describes the type of graphics by the coordinates, and indicates the graphic to be output by "0" and indicates the graphic which is not output by "1". Because the graphic information of the graphic pattern 401 is (0, A1, A7, H7, H2, K2, K1) and the graphic information of the graphic pattern 402 is (0, H7, H8, R8, R2, K2, K7) in this case, the graphic information of the graphic pattern 403 which is obtained by carrying out the logical/sizing process of the step 44 shown in FIG. 4, more particularly, the AND process, becomes (1, H2, H7, K7, K2).

Figure 16:
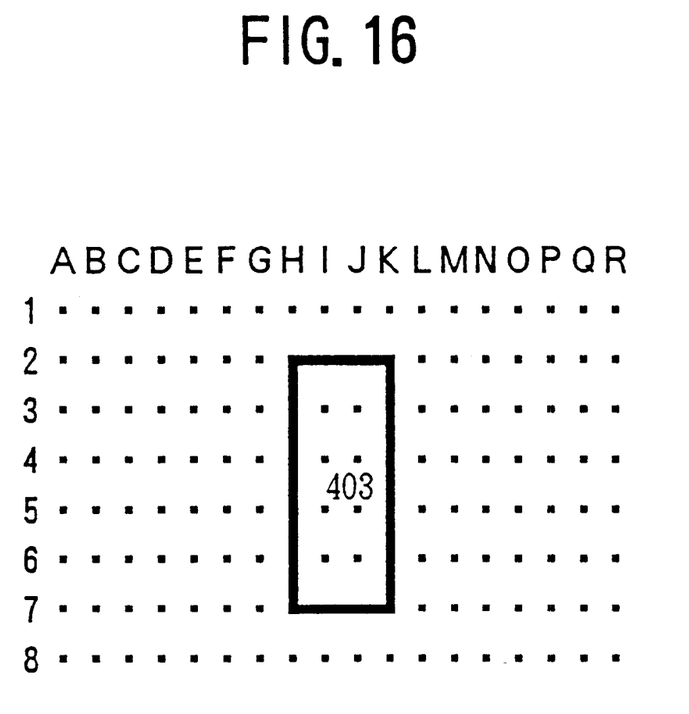
FIG. 16 is a diagram for explaining the logical process of the logical/sizing process.

FIG. 16 is a diagram showing a graphic pattern 403 which is obtained by carrying out the format conversion process of the step 53 shown in FIG. 4 with respect to the graphic pattern 403 shown in FIG. 15. In this case, the graphic information of the graphic pattern 403 shown in FIG. 16 is described by the vertex coordinates of the graphic pattern 403. Accordingly, the graphic information of the graphic pattern 403 shown in FIG. 16 becomes (H2, H7, K7, K2).

When such an AND process is carried out as the logical process of the step 44 shown in FIG. 4, the reverse-logical process carried out in the step 48 does not carry out a particular process with respect to the graphic data shown in FIG. 15. In addition, the logical process of the step 50 carries out an exclusive-OR process between the original data related.to the graphic patterns shown in FIG. 14 and stored in the step 43 and the graphic pattern shown in FIG. 15 and obtained in the step 44. If a deformation, dropout or the like is generated in the graphic pattern due to the software bugs and/or hardware bugs, it is possible to positively find the bugs by this exclusive-OR process.

Further, the present invention is not limited to these embodiments, but various variations and modifications may be made without departing from the scope of the present invention.

what is claimed is:

1. A pattern data Inspection method comprising:

carrying out a logical/sizing process with respect to original pattern data;

carrying out a reverse-logical/reverse-sizing process with respect to pattern data subjected to the logical/sizing process; and carrying out a logical process with respect to the original pattern data and pattern data subjected to the reverse-logical/reverse-sizing process, and inspecting the pattern data subjected to the logical/sizing process, wherein the original pattern data include design data that are used to produce a semiconductor device.

2. The pattern data inspection method as claimed in claim 1, wherein said carrying out a logical/sizing process stores vertex information of pattern data subjected to the logical/sizing process, corresponding to all vertex information of patterns within the original pattern data prior to carrying out the logical/sizing process.

3. The pattern data inspection method as claimed in claim 2, wherein said carrying out a reverse-logical/reverse-sizing process stores vertex information of pattern data subjected to the reverse-logical/reverse-sizing process, corresponding to all vertex information of patterns within the pattern data prior to carrying out the reverse-logical/reverse-sizing process.

4. The pattern data inspection method as claimed in claim 1, which further comprises:

converting original data into data having an internal format, prior to said carrying out a logical/sizing process, so as to obtain the original pattern data.

5. A computer-readable storage medium which stores a program for causing a computer to inspect pattern data, comprising:

first means for causing the computer to carry out a logical/sizing process with respect to original pattern data;

second means for causing the computer to carry out a reverse-logical/reverse-sizing process with respect to pattern data subjected to the logical/sizing process; and third means for causing the computer to carry out a logical process with respect to the original pattern data and pattern data subjected to the reverse-logical/reverse-sizing process, and inspect the pattern data subjected to the logical/sizing process, wherein the original pattern data include design data that are used to produce a semiconductor device.

6. The computer-readable storage medium as claimed in claim 5, wherein said first means causes the computer to store vertex information of pattern data subjected to the logical/sizing process, corresponding to all vertex information of patterns within the original pattern data prior to carrying out the logical/sizing process.

7. The computer-readable storage medium as claimed in claim 6, wherein said second means causes the computer to store vertex information of pattern data subjected to the reverse-logical/reverse-sizing process, corresponding to all vertex information of patterns within the pattern data prior to carrying out the reverse-logical/reverse-sizing process.

8. The computer-readable storage medium as claimed in claim 5, which further comprises:

fourth means for causing the computer to convert original data into data having an internal format, prior to the logical-sizing process of said first means, so as to obtain the original pattern data.

* * * * *

UNITED STATES PATENT AND TRADEMARK OFFICE
CERTIFICATE OF CORRECTION

PATENT NO.     : 6,598,185 B1
DATED          : July 22, 2003
INVENTOR(S)    : Showgo Matsui et al.

It is certified that error appears in the above-identified patent and that said Letters Patent is hereby corrected as shown below:

<u>Column 8,</u>
Line 38, change "Inspection" to -- inspection --.

Signed and Sealed this

Twenty-fifth Day of May, 2004

JON W. DUDAS
*Acting Director of the United States Patent and Trademark Office*